United States Patent [19]

Ford

[11] Patent Number: 4,902,639
[45] Date of Patent: Feb. 20, 1990

[54] PROCESS FOR MAKING BICMOS INTEGRATED CIRCUIT HAVING A SHALLOW TRENCH BIPOLAR TRANSISTOR WITH VERTICAL BASE CONTACTS

[75] Inventor: Jenny M. Ford, Mesa, Ariz.

[73] Assignee: Motorola, Inc., Schaumburg, Ill.

[21] Appl. No.: 388,885

[22] Filed: Aug. 3, 1989

[51] Int. Cl.⁴ .................... H01L 21/283; H01L 302
[52] U.S. Cl. ........................... 437/56; 437/31; 437/33; 437/58; 437/38; 437/203
[58] Field of Search ................ 437/31, 38, 32, 33, 437/203, 56, 58, 59; 357/34, 35

[56] References Cited

U.S. PATENT DOCUMENTS

| | | |
|---|---|---|
| 4,483,726 | 11/1984 | Isaac et al. ............................ 437/31 |
| 4,546,536 | 10/1985 | Anantha et al. ...................... 357/35 |
| 4,745,080 | 5/1988 | Scovell et al. ........................ 437/31 |
| 4,774,206 | 9/1988 | Willen ................................. 437/203 |
| 4,818,713 | 4/1989 | Feygenson ............................ 437/31 |
| 4,847,670 | 7/1989 | Monkowski et al. ................... 357/34 |

*Primary Examiner*—Brian E. Hearn
*Assistant Examiner*—T. N. Quach
*Attorney, Agent, or Firm*—Joe E. Barbee

[57] ABSTRACT

An improved bipolar transistor of a BiCMOS integrated circuit is fabricated by utilizing a shallow trench structure. The shallow trench defines an active base and a self-aligned emitter. The base resistance of the transistor is reduced because a vertical, rather than lateral, link base, which connects an extrinsic base to the active base, is formed. In addition, the overall area is reduced, which provides for a lower collector to base capacitance.

16 Claims, 5 Drawing Sheets

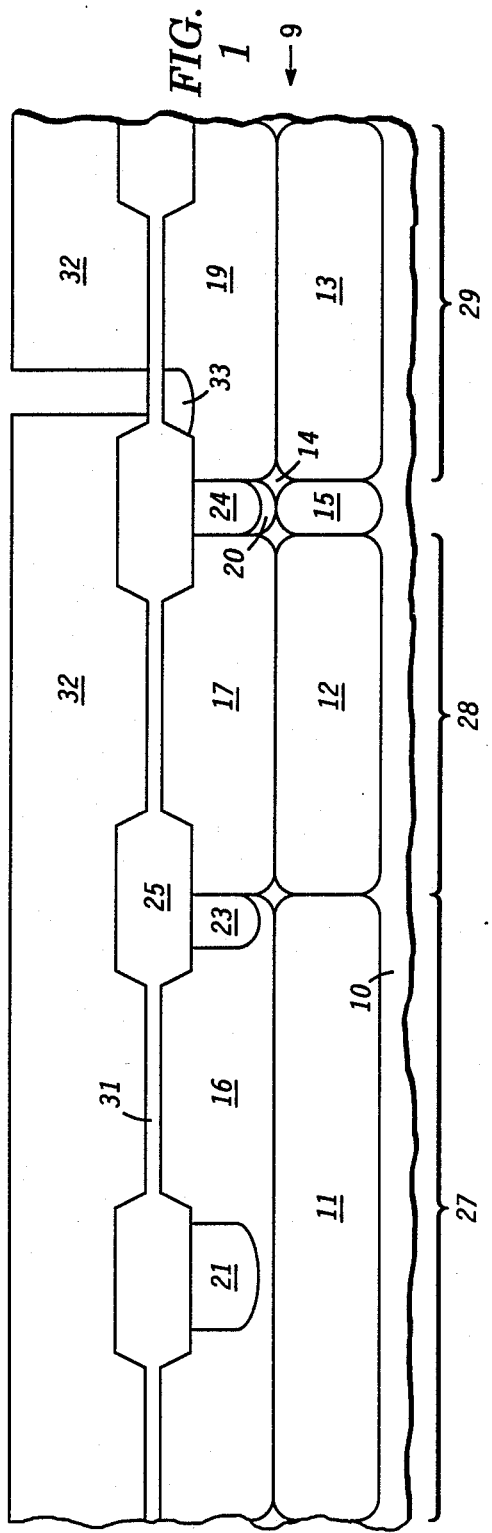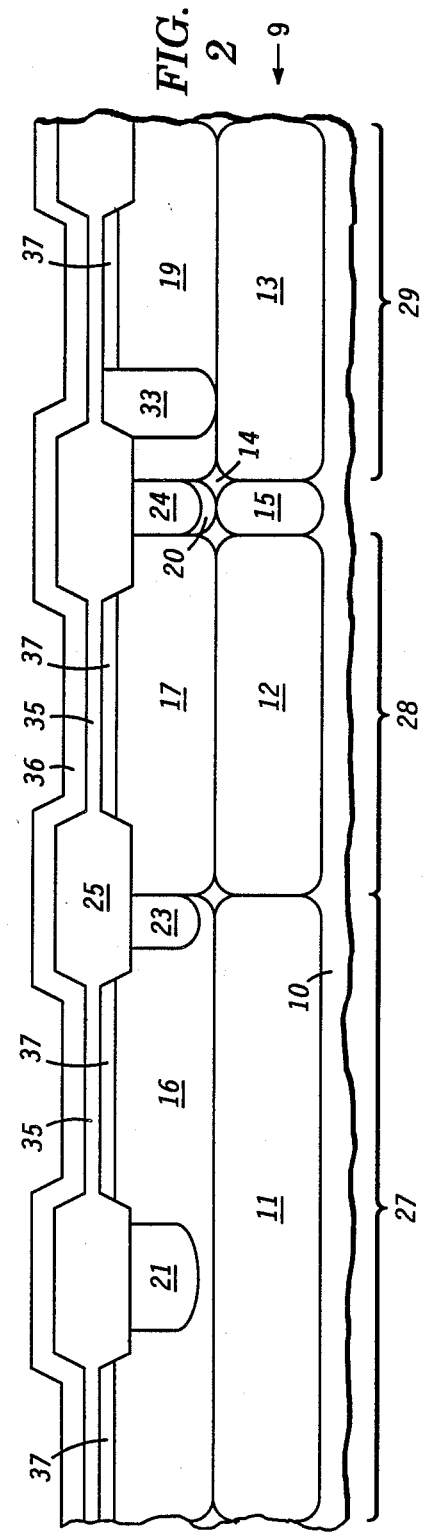

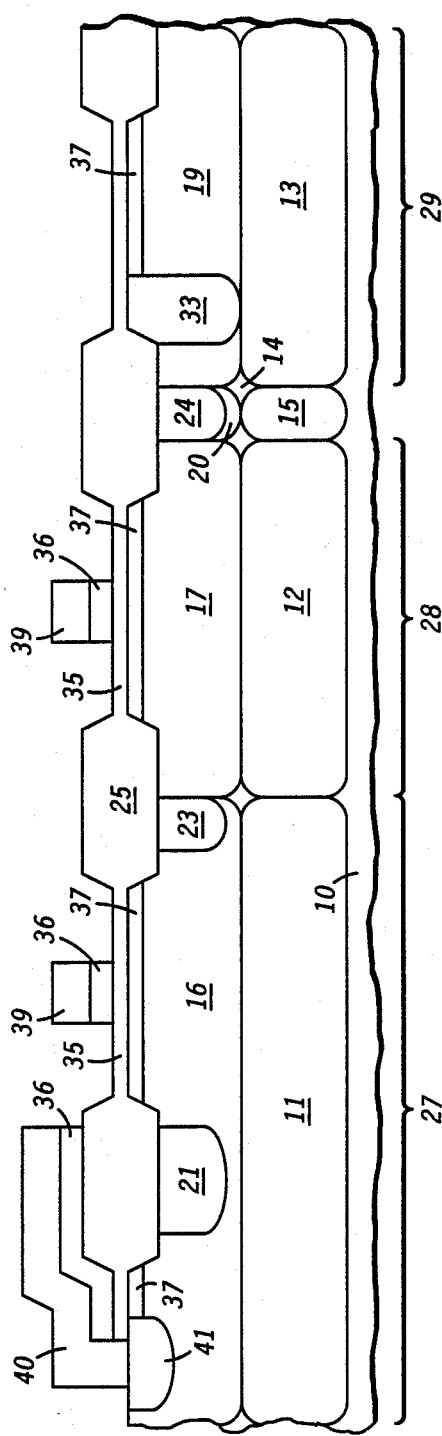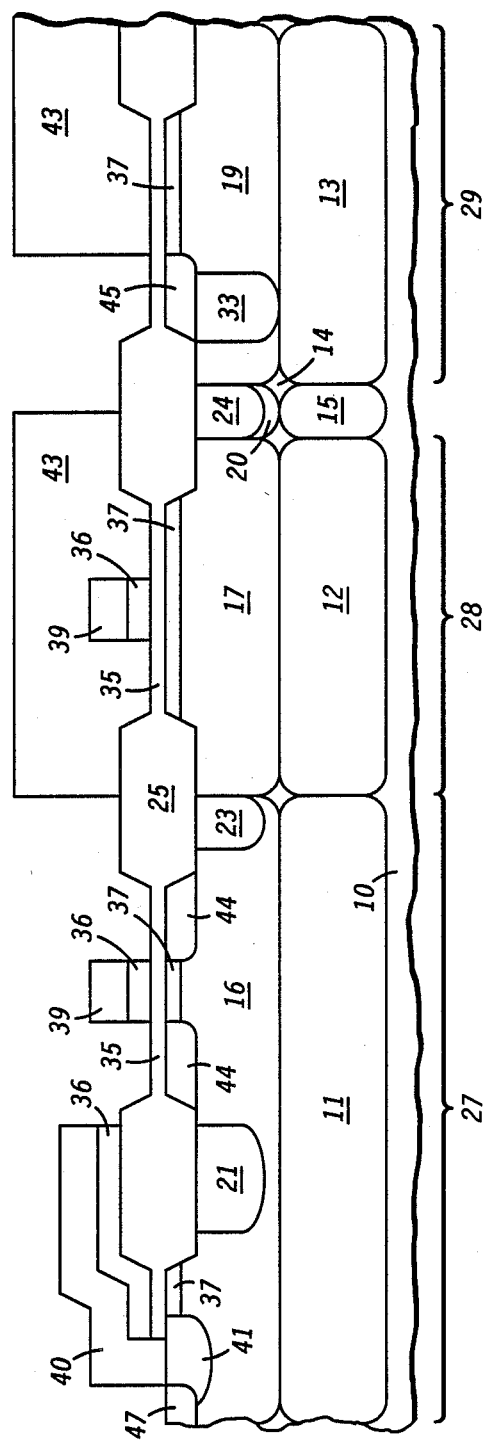

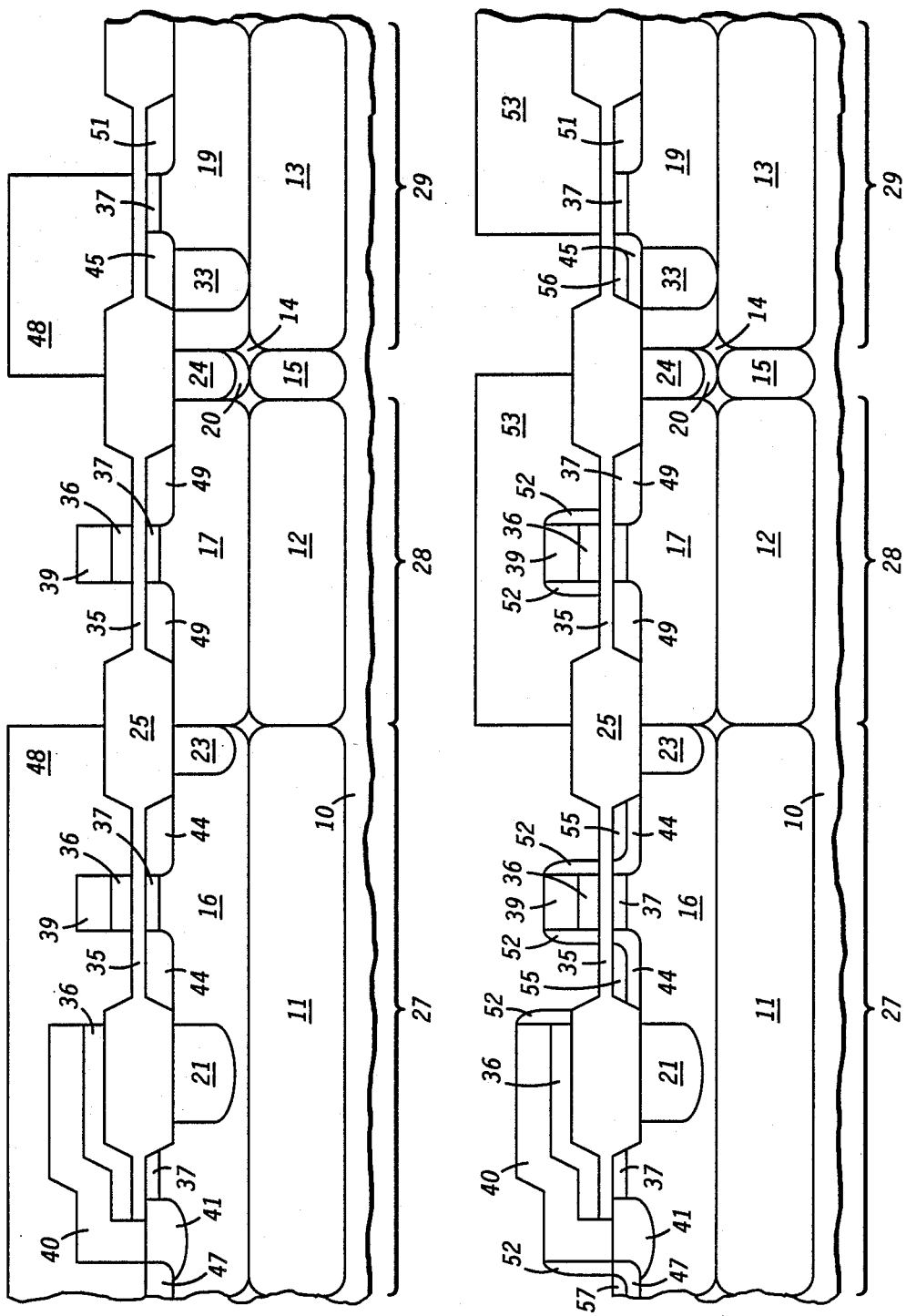

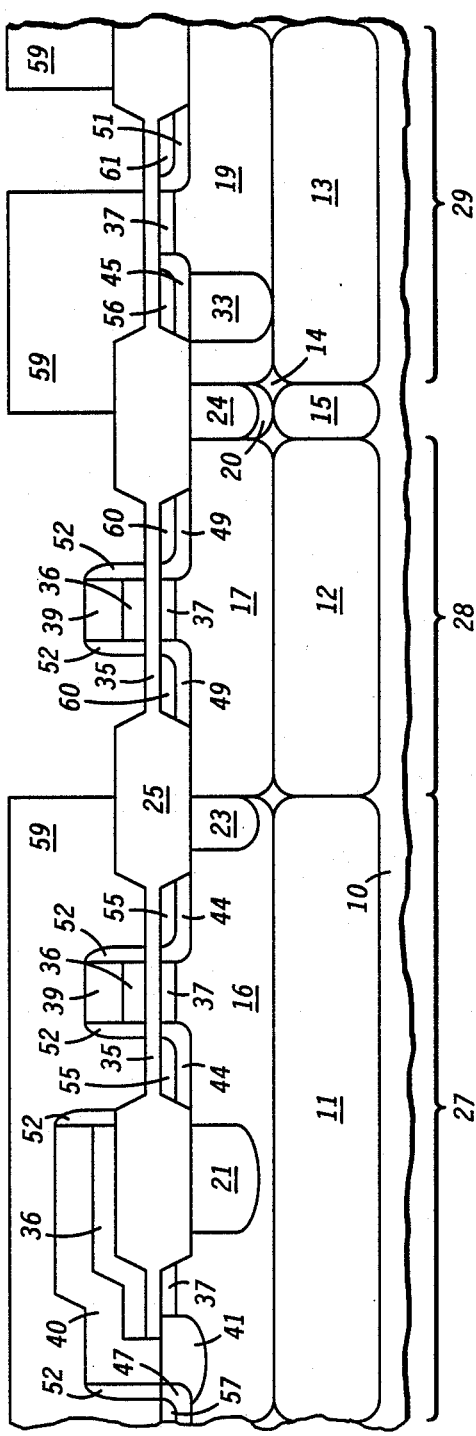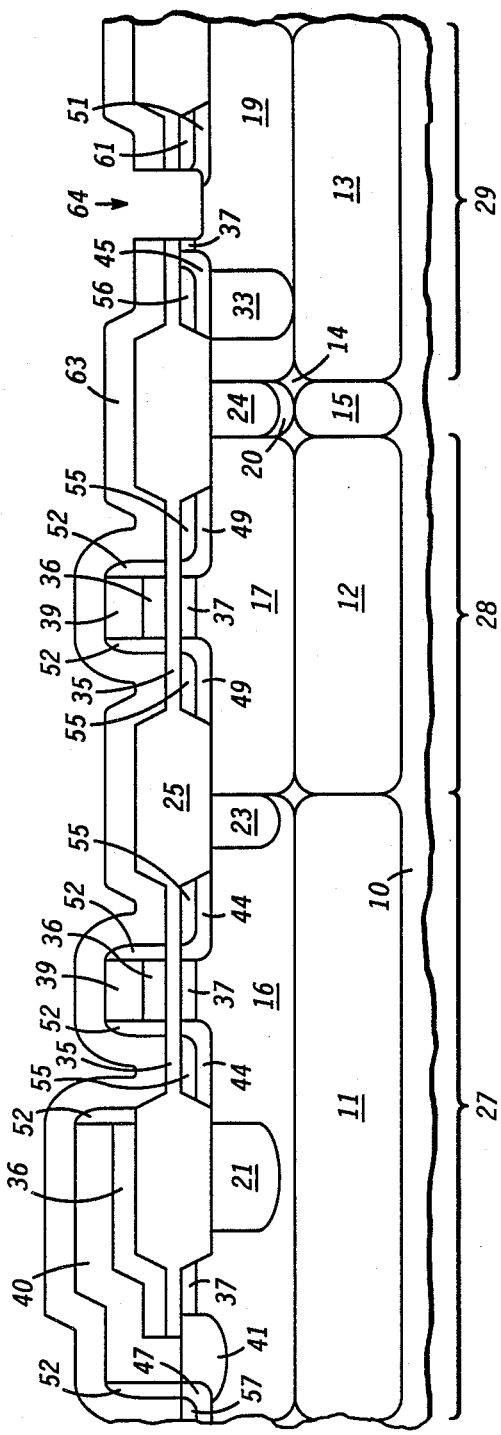

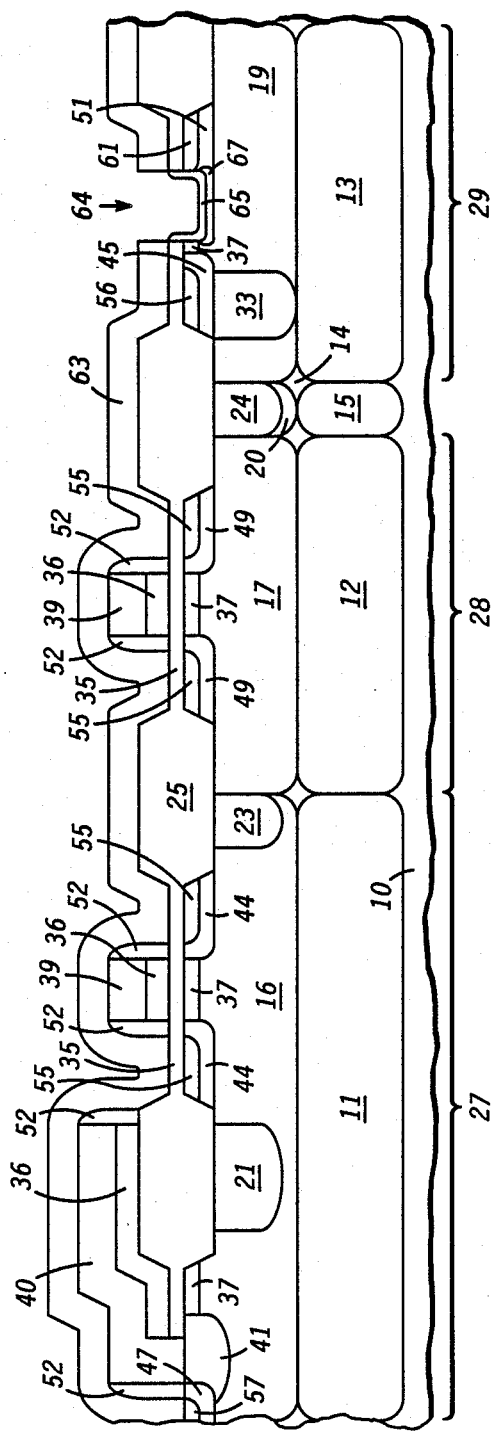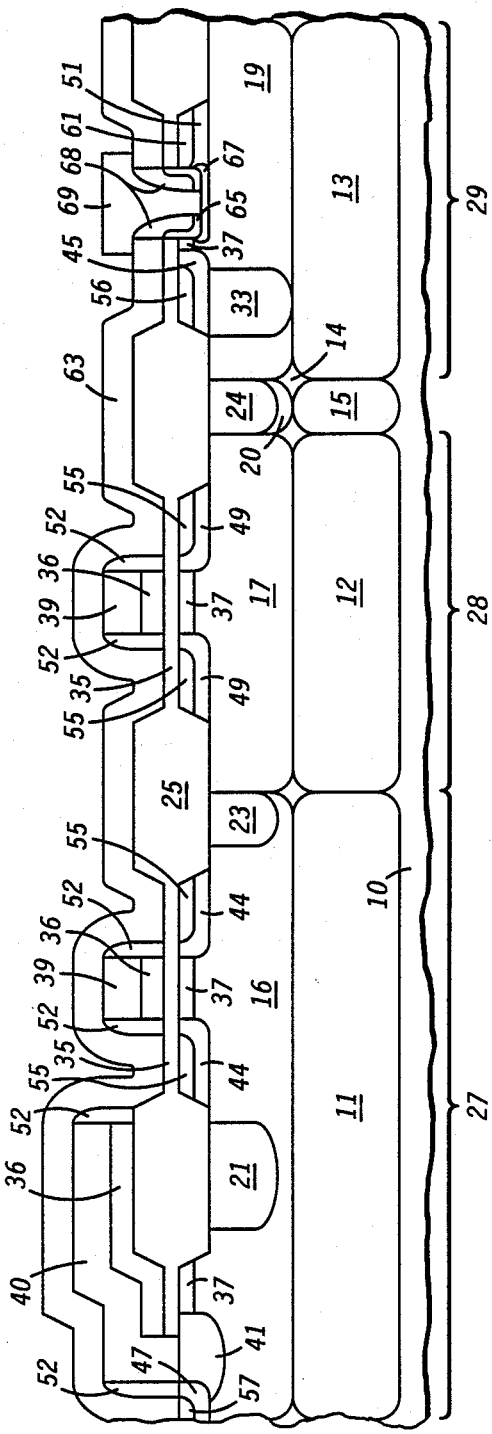

PROCESS FOR MAKING BICMOS INTEGRATED CIRCUIT HAVING A SHALLOW TRENCH BIPOLAR TRANSISTOR WITH VERTICAL BASE CONTACTS

BACKGROUND OF THE INVENTION

This invention relates, in general, to semiconductor devices, and more particularly, to an improved method of fabricating a BiCMOS integrated circuit having a high performance bipolar transistor.

When integrating bipolar transistors with CMOS transistors, compromises must be made to either the CMOS transistors or the bipolar transistors, or both, in order to integrate all the transistors on a single chip. Thus, any improvement which simplifies the BiCMOS fabrication process or improves the electrical characteristics of the transistors is desirable. Where NPN performance is heavily used, it is desirable to produce a bipolar which has a higher performance. In order to fabricate a high performance bipolar, it is essential to provide a minimum low current base resistance ($R_b$) and minimum transistor junction capacitances. A lower base resistance will improve the switching speed of the bipolar transistor. It is also desirable to reduce the junction capacitances of the bipolar transistor, especially the base-collector ($C_{bc}$), and the parasitic capacitances.

In terms of device fabrication, it is desirable to reduce the number of photolithography masks that are used in the process. This will allow for an improvement in device yield and a decrease in cycle time. In addition, it would be advantageous to be able to fabricate both NPN and PNP transistors on the same chip without many added masks or process steps. As technology enables the devices to be fabricated with smaller dimensions, it is desirable to make a bipolar transistor which is more scalable than in the past. A device is defined as being more scalable than another if it exhibits decreased sensitivity to drawn dimensions or lithographic tolerances.

By now it should be appreciated that it would be advantageous to provide an improved method of fabricating a high performance bipolar transistor that is also compatible with the method of fabricating MOS transistors.

Accordingly, it is an object of the present invention to provide an improved method of fabricating a BiCMOS integrated circuit having high performance bipolar transistors.

Another object of the present invention is to provide an improved method of fabricating a BiCMOS integrated circuit having bipolar transistors which have a reduced base resistance.

A further object of the present invention is to provide an improved method of fabricating a BiCMOS integrated circuit having high performance bipolar transistors which have improved switching speed.

Yet another object of the present invention is to provide an improved method of fabricating both vertical NPN and vertical PNP bipolar transistors integrated with CMOS transistors.

Still a further object of the present invention is to provide an improved method of fabricating bipolar transistors which have reduced collector to base capacitance.

SUMMARY OF THE INVENTION

In accordance with the present invention, the above and other objects and advantages are provided by a method of fabricating a bipolar transistor in a shallow trench. The shallow trench defines the active base and the self-aligned emitter, thereby eliminating sensitivity to the inactive base/emitter spacing. A vertical link base connects a P+ extrinsic base region and the active base region. This vertical link, rather than a lateral link, produces a bipolar transistor having reduced base resistance. In addition, the reduced base area of the bipolar transistor reduces the collector to base capacitance. This process is very compatible with MOS technology, thus high density, high performance BiCMOS integrated circuits can be fabricated.

BRIEF DESCRIPTION OF THE DRAWINGS

FIGS. 1–10 illustrate enlarged, cross-sectional views of a portion of a BiCMOS integrated circuit during various stages of fabrication.

DETAILED DESCRIPTION OF THE DRAWINGS

FIG. 1 illustrates an enlarged, cross-sectional view of a portion of a BiCMOS integrated circuit 9 in a beginning stage of fabrication. What is shown is a P+ buried layer 11, an N+ buried layer 12, a P+ buried layer 15 and an N+ buried layer 13, all fabricated in a P-type substrate 10. An epitaxial layer 14 is then formed on the surface of buried layers 11, 12, 13 and 15. Subsequently, a P-type well 16, an N-type well 17, a P-type well 20 and an N-type well 19 are all formed in epitaxial layer 14. Next, a P+ field region 21, a second P+ field region 23, and a third P+ field region 24 are all formed in epitaxial region 14 as shown in FIG. 1. The above processes are all well known in the art. Thereafter, field oxide regions 25 are formed on the surface of integrated circuit 9. Field oxide regions 25, along with P+ field regions 21, 23 and 24, form isolated regions which define an NMOS device region 27, a PMOS device region 28 and an NPN device region 29. For illustrative convenience, only a PMOS, an NMOS and a NPN transistor will be shown. However, combinations of PMOS, NMOS, NPN, and PNP (not shown) transistors are typically fabricated on a single chip. A suitable method of forming field oxide regions 25 is with the use of an oxide, polysilicon and silicon nitride mask (not shown), however, other processes which are also well known in the art are also suitable. Before beginning fabrication of the active part of BiCMOS integrated circuit 9, a sacrificial oxide layer 31 is grown on the surface of integrated circuit 9. Sacrificial oxide layer 31 is used to clean up and protect the surface of integrated circuit 9. Subsequently, a photoresist layer 32 is formed and patterned on the surface of integrated circuit 9. An N-type dopant, such as phosphorous, or the like, is then implanted to form an N+ deep collector region 33 in NPN device region 29. N+ deep collector 33 reduces the series resistance of the collector contact to the active NPN transistor to be fabricated by lowering the resistance between the surface of integrated circuit 9 and N+ buried layer 13.

FIG. 2 illustrates the structure of FIG. 1 further along in the fabrication process. Photoresist layer 32 has been removed, as well as sacrificial oxide layer 31. A thin gate oxide layer 35 is then grown on the surface of integrated circuit 9 in between field oxide regions 25.

On the surface of gate oxide layer 35 and field oxide regions 25, a thin polysilicon layer 36 is deposited. Subsequently, a P-type dopant, such as boron, or the like, is implanted into the surface of integrated circuit 9. Note that field oxide regions 25 prevent the penetration of the dopants such that P-type regions 37 only form in NMOS device region 27, PMOS device region 28 and NPN device region 29. Region 37 acts as a threshold adjust for NMOS device region 27 and PMOS device region 28. Because the surface of integrated circuit 9 is not masked, region 37 also forms in NPN device region 29. Region 37 is not detrimental to NPN device region 29, however, it may be desirable to mask out the dopants in order to prevent the formation of region 37 in NPN device region 29. A subsequent masked doping may be desirable in either NMOS or PMOS device region 27 or 28 to provide for further threshold adjust, however, that process step is not illustrated. Note that N+ deep collector region 33 has been driven in by exposure of integrated circuit 9 to high temperature of some of the processing steps that have taken place.

Shown in FIG. 3 is the structure of FIG. 2 further along in the fabrication process. First, a second polysilicon layer is formed on the surface of thin polysilicon layer 36. The second polysilicon layer is then heavily doped with an N+ dopant, such as phosphorous, arsenic, or the like. This second polysilicon layer could also be deposited as a heavily doped N+ layer using in-situ doping techniques. In FIG. 3, the second polysilicon layer and polysilicon layer 36 are shown after they have been patterned by using standard photolithography and etch processes to form polysilicon layers 39 over the surface of NMOS device region 27 and PMOS device region 28, and polysilicon layer 40 over P+ field region 21 and a portion of NMOS device region 27. Polysilicon layer 40 forms a buried contact region 41. Since polysilicon layer 40 is heavily doped, buried contact N+ region 41 is diffused into P-well region 16 after integrated circuit 9 is subjected to a high temperature anneal. Formation of polysilicon 40 and buried contact region 41 are optional structures which do not have to be formed. A buried contact structure is utilized to make contact to the gate of one transistor and the drain of another transistor without taking up much surface area.

FIG. 4 illustrates the structure of FIG. 3 with a photoresist layer 43 formed and patterned on the surface of integrated circuit 9. Subsequently, an N-type dopant is implanted into the surface of integrated circuit 9 not protected by photoresist mask 43. In this step N-type regions 44, 45 and 47 are formed. N-type region 45 acts as a top contact collector which provides for further enhancement of N+ collector region 33, in order to provide the lowest resistance to buried layer 13. Regions 44 form N-type source/drain regions for NMOS device region 27. Lastly, N-type region 47 is formed adjacent to buried contact region 41 in order to provide for a low resistance contact.

FIG. 5 illustrates the structure of FIG. 4 further along in the fabrication process. Photoresist layer 43 is removed and another photoresist layer 48 is formed and patterned on the surface of integrated circuit 9. A P-type dopant is implanted into the surface of integrated circuit 9 which is not protected by photoresist layer 48. P-type source/drain regions 49 are formed in PMOS device region 28. At the same time, an extrinsic base region 51 is formed in NPN device region 29.

FIG. 6 illustrates the structure of FIG. 5 further along in the fabrication process. Photoresist layer 48 is removed from the surface of integrated circuit 9. Subsequently, an oxide layer is formed on the surface of integrated circuit 9 and then etched to form sidewall spacers 52 adjacent to polysilicon layers 36, 39 and 40. This process is well known in the art. Next, photoresist layer 53 is formed and patterned on the surface of integrated circuit 9. Subsequently, an N+ dopant is implanted into the unmasked surface of integrated circuit 9. N+ source/drain regions 55 are formed in NMOS device region 27, which forms, along with N-type regions 44, lightly doped source and drain regions (LDD), which are well known in the art. Lightly doped source and drain regions increase the reliability of the MOS device because the more heavily doped regions 55 are spaced from the edge of the area under polysilicon gate 39. In NPN device region 29, the N+ dopant forms an N+ top contact collector region 56 to further enhance the doping of N+ deep collector 33 at the surface. An N+ region 57 is also formed in N-type region 47 of NMOS device region 27, providing enhanced contact in optional buried contact region 41.

FIG. 7 illustrates the structure of FIG. 6 after further processing. Photoresist layer 53 is removed, and a photoresist layer 59 is formed and patterned on the surface of integrated circuit 9. Then, a P+ dopant is implanted into the unmasked portions of integrated circuit 9. P+ source/drain regions 60 are formed in PMOS device region 28 to form, along with P+ regions 49, lightly doped source and drain regions. In addition, the P+ dopant also forms a P+ extrinsic base region 61 which enhances the doping of extrinsic base 51.

Shown in FIG. 8 is the structure of FIG. 7 after photoresist layer 59 has been removed, and a thick layer of an oxide 63 is formed on the surface of integrated circuit 9. In a preferred embodiment, a low temperature oxide 63 having a thickness of approximately 2500 angstroms is used. Next, a shallow trench 64 is etched in oxide 63 through regions 51 and 61 and into N-type well 19 in NPN device region 29 using photolithography and etch processes. Shallow trench 64 is etched such that the bottom of shallow trench 64 is deeper than P+ extrinsic base 61 and slightly shallower than extrinsic base 51. It is desirable that the bottom of shallow trench 64 not be lower than extrinsic base region 51, and also that shallow trench 64 extend into extrinsic base region 51 in order to obtain optimum device characteristics. Shallow trench 64 is positioned to easily overlap extrinsic base region 51 and 61 so alignment tolerances are loose. Shallow trench 64 can be formed by using a Reactive Ion Etch (RIE), or other etch processes which form a vertical trench sidewall.

FIG. 9 illustrates the structure of FIG. 8 after further processing. A thin layer of oxide 65, which acts as a screen oxide for the implantation process, is formed at the bottom of shallow trench 64. A P-type dopant is then implanted in shallow trench 64 to form an active base region 67. In a preferred embodiment, a dose of approximately $2 \times 10^{13}$ atoms/cm$^2$ of boron is used. Other suitable P-type dopants and doses may also be used which provide for a bipolar transistor having acceptable electrical characteristics. Because active base region 67 is formed at the bottom of shallow trench 64, which cuts through P+ extrinsic base region 61, it is self-aligned to P+ extrinsic base region 61 and extrinsic base region 51. As can be seen in FIG. 9, extrinsic base region 51 provides a vertical link base connecting active base region 67 to P+ extrinsic base region 61. This vertical link produces a bipolar transistor having reduced base resistance.

FIG. 10 illustrates the structure of FIG. 9 further along in the fabrication process. A layer of oxide is deposited on the surface of low temperature oxide layer 63 and in shallow trench 64. Subsequently, the oxide layer is etched to form oxide sidewalls 68 within shallow trench 64. The sidewall etch also removes a portion of oxide 65, thus opening active base region 67 for further processing. A polysilicon layer is then deposited on the surface of integrated circuit 9 and etched to form a polysilicon emitter 69, which makes contact to active base region 67. In this manner, polysilicon emitter 69 is self-aligned to active base region 67, thus reducing the spacing between polysilicon emitter 69 and highly doped P+ extrinsic base region 61. This spacing is critical because it controls the base resistance of the bipolar transistor. In the present invention this spacing is determined by the thickness of sidewall spacer 68, which can be as small as approximately 0.1 micron using the present technology. In the past, the spacing between an emitter and base was approximately 1.0 micron and varied due to misalignment of those layers. Thus, a bipolar transistor fabricated according to the present invention can improve the base resistance of a bipolar transistor by one order of magnitude. Reducing this spacing also reduces the base-collector area by approximately 10%, thus reducing the transistor parasitic capacitances. These reductions allow a significant increase in switching speed.

A portion of emitter polysilicon layer 69 can also be used as resistors (not shown). However, if polysilicon resistors are not required, then polysilicon emitter 69 can be etched back without using a photoresist mask, eliminating a mask from the current process. Subsequently, polysilicon emitter layer 69 is doped N-type using suitable masks and implants. During this process or in an anneal, a very shallow N-type emitter junction (not shown) is formed in active base region 67 from the doping of polysilicon emitter 69. Further processing to complete BiCMOS integrated circuit 9 is well known in the art, and therefore not illustrated.

Note that a PNP bipolar transistor can also be easily integrated into BiCMOS integrated circuit 9 by introducing the opposite conductivity type dopants than are shown in NPN device region 29, except substrate 10 and threshold adjust region 37, into another device region similar to NMOS region 27 having P well and P buried layers. Also, a PNP bipolar transistor does not typically require a deep collector region because high performance is not demanded. The top contact collector regions are provided by the PMOS source/drains, and the extrinsic base regions are provided by the NMOS source/drains.

By now it should be appreciated that there has been provided a new and improved method of fabricating a high performance bipolar transistor that is compatible with a method of fabricating CMOS transistors. The bipolar transistor formed by the present invention forms a vertical, rather than lateral, link base which reduces the base resistance. A reduction in base resistance provides for a bipolar transistor having greater switching speed. In addition, the elimination of the lateral link base reduces the overall area, which lowers the collector to base capacitance. The vertical structure is also easily scalable.

What is claimed:

1. A method of fabricating a BiCMOS integrated circuit, comprising the steps of:
    providing a semiconductor substrate;
    forming at least an isolated NMOS device region, at least an isolated PMOS device region and at least an isolated bipolar device region in the substrate;
    forming a gate oxide layer and a polysilicon gate region over the isolated NMOS device region and over the PMOS device region;
    forming a first source region and a first drain region in the isolated NMOS device region;
    forming a second source region and a second drain region in the isolated PMOS device region, and forming a first extrinsic base region in the isolated bipolar device region;
    forming an oxide layer over the substrate;
    forming a shallow trench in the oxide and in the isolated bipolar device region of the substrate, wherein the shallow trench is etched slightly shallower than the depth of the first extrinsic base region and slightly overlapping the first extrinsic base region;
    forming an active base region in the substrate at the bottom of the shallow trench;
    forming sidewall spacers in the shallow trench opening; and
    forming a polysilicon emitter region self-aligned in the shallow trench.

2. The method of claim 1 further comprising the steps of:
    forming a deep collector region in the isolated bipolar region before the step of forming the gate oxide layer and the polysilicon gate region; and
    forming a top contact collector region partially overlapping the deep collector region when forming the first source and the first drain regions.

3. The method of claim 1 wherein the active base is formed by ion implanting boron at a dose of approximately $2 \times 10^{13}$ atoms/cm$^2$ in the substrate at the bottom of the shallow trench.

4. The method of claim 1 further comprising the step of: forming a second extrinsic base region in the first extrinsic base region, wherein the second extrinsic base region is more heavily doped and shallower than the first extrinsic base region.

5. The method of claim 4 further comprising the steps of:
    forming a first lightly doped source and drain structure in the isolated NMOS device region; and
    forming a second lightly doped source and drain structure in the isolated PMOS region when forming the second extrinsic base region.

6. A method of fabricating a bipolar transistor of a BiCMOS integrated circuit, comprising the steps of:
    providing a semiconductor substrate;
    forming at least an isolated NMOS device region, at least an isolated PMOS device region and at least an isolated bipolar device region in the substrate;
    forming an NMOS transistor in the isolated NMOS device region, and a PMOS transistor in the isolated PMOS device region;
    forming a first extrinsic base region in the isolated bipolar device region;
    forming an oxide layer over the substrate;
    forming a shallow trench in the oxide and in the isolated bipolar device region of the substrate, wherein the shallow trench is etched slightly shallower than the depth of the first extrinsic base region and slightly overlapping the first extrinsic base region;

forming an active base region in the substrate at the bottom of the shallow trench;

forming sidewall spacers in the shallow trench opening; and forming a polysilicon emitter region self-aligned in the shallow trench.

7. The method of claim 6 further comprising the step of: forming a deep collector region in the isolated bipolar device region before forming the first extrinsic base region.

8. The method of claim 6 wherein the active base is formed by ion implanting boron at a dose of approximately $2 \times 10^{13}$ atoms/cm$^2$ in the substrate at the bottom of the shallow trench.

9. The method of claim 6 further comprising the step of:

forming a second extrinsic base region in the first extrinsic base region, wherein the second extrinsic base region is more heavily doped and shallower than the first extrinsic base region, and the trench is deeper than and slightly overlapping the second extrinsic base.

10. A method of fabricating a BiCMOS integrated circuit, comprising the steps of:

providing a semiconductor substrate;

forming at least an isolated NMOS device region, at least an isolated PMOS device region and at least an isolated bipolar device region in the substrate;

forming a deep collector region in the isolated bipolar device region;

forming a gate oxide layer and a polysilicon layer over the substrate;

etching the polysilicon layer to form polysilicon gate regions over the isolated NMOS device region and over the isolated PMOS device region;

forming a first source region and a first drain region in the isolated NMOS device region, and forming a first top contact collector region partially overlapping the deep collector region;

forming a second source region and a second drain region in the isolated PMOS device region, and forming a first extrinsic base region in the isolated bipolar device region;

forming sidewall spacers adjacent to the polysilicon gate regions;

forming a third source and a third drain region in the first source and first drain regions to create lightly doped source and drain regions, and forming a second top contact collector region in the first top contact collector region;

forming a fourth source and a fourth drain region in the second source and second drain regions to create laterally doped source and drain regions, and forming a second extrinsic base region in the first extrinsic base region;

forming an oxide layer over the substrate;

forming a shallow trench in the oxide and in the isolated bipolar device region of the substrate, wherein the shallow trench is etched slightly shallower than the depth of the first extrinsic base region, but slightly deeper than the second extrinsic base region and slightly overlapping the first and the second extrinsic base regions;

forming an active base region in the substrate at the bottom of the shallow trench;

forming an oxide sidewall spacer in the shallow trench; and forming a doped polysilicon emitter region self-aligned in the shallow trench.

11. The method of claim 10 wherein the active base is formed by ion implanting boron at a dose of approximately $2 \times 10^{13}$ atoms/cm$^2$ in the substrate at the bottom of the shallow trench.

12. The method of claim 10 further comprising the step of: forming a buried contact region making contact to the NMOS isolated region.

13. A method of providing a bipolar transistor in a BiCMOS integrated circuit, comprising the steps of:

providing a substrate having a buried layer which serves as a collector;

forming a first extrinsic base region in the substrate;

etching a shallow trench into the first extrinsic base region;

forming an active base in the substrate at the bottom of the shallow trench;

forming sidewall spacers along walls of the shallow trench; and forming an emitter in the shallow trench which reaches to the bottom of the shallow trench and makes contact with the active base.

14. The method of claim 13 wherein the active base is formed by ion implanting boron at a dose of approximately $2 \times 10^{13}$ atoms/cm$^2$ in the substrate at the bottom of the shallow trench.

15. The method of claim 13 further comprising the step of: forming a deep collector region in the substrate before forming the first extrinsic base region.

16. The method of claim 13 further comprising the step of: forming a second extrinsic base region in the first extrinsic base region.

* * * * *